US006624850B1

(12) United States Patent
Guidash

(10) Patent No.: US 6,624,850 B1
(45) Date of Patent: Sep. 23, 2003

(54) PHOTOGATE ACTIVE PIXEL SENSOR WITH HIGH FILL FACTOR AND CORRELATED DOUBLE SAMPLING

(75) Inventor: Robert M. Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/223,039

(22) Filed: Dec. 30, 1998

(51) Int. Cl.[7] .............................. H04N 3/14; H04N 5/335
(52) U.S. Cl. ..................... 348/308; 348/301; 348/241
(58) Field of Search ................................. 257/292, 291; 348/301, 307, 308, 243, 302

(56) References Cited

U.S. PATENT DOCUMENTS

| 5,153,420 A | * 10/1992 | Hack et al. ................ 348/302 |
| 5,471,515 A | 11/1995 | Fossum et al. .............. 377/60 |
| 5,587,596 A | 12/1996 | Chi et al. ................... 257/223 |
| 5,608,243 A | 3/1997 | Chi et al. ................... 257/249 |
| 5,625,210 A | 4/1997 | Lee et al. ................... 257/292 |
| 5,631,704 A | 5/1997 | Dickinson et al. .......... 348/308 |
| 5,721,425 A | 2/1998 | Merrill ...................... 250/214.1 |
| 5,760,458 A | 6/1998 | Bergemont et al. ........ 257/588 |
| 5,786,623 A | 7/1998 | Bergemont et al. ........ 257/587 |
| 5,789,774 A | 8/1998 | Merrill ....................... 257/292 |
| 5,793,423 A | * 8/1998 | Hamasaki ................. 348/301 |
| 5,838,650 A | 11/1998 | Campbell et al. .......... 369/103 |
| 5,841,126 A | 11/1998 | Fossum et al. ............ 250/208.1 |
| 5,847,422 A | 12/1998 | Chi et al. ................... 257/291 |
| 5,923,794 A | * 7/1999 | McGrath et al. ........... 257/292 |

FOREIGN PATENT DOCUMENTS

EP  1 003 220 A2  5/2000  .......... H01L/27/146

OTHER PUBLICATIONS

"Active Pixel Sensors: Are CCD's Dinosaurs?" by Eric R. Fossum. Jet Propulsion Laboratory, California Institute of Technology. SPIE vol. 1900.

(List continued on next page.)

Primary Examiner—Wendy R. Garber
Assistant Examiner—Jason Whipkey
(74) Attorney, Agent, or Firm—Peyton C. Watkins

(57) ABSTRACT

The present invention provides a high fill factor Photogate Active Pixel Architecture with the capability to perform Correlated Double Sampling, (CDS). The functionality of a 4 transistor pixel is maintained while eliminating the separate row select transistor. This is done by using the same control signal for the photogates and the Row Select signal. The preferred embodiment of the invention employs a floating diffusion as the charge to voltage conversion node and specifically envisions embodiments wherein the source of the reset transistor is a floating diffusion and the drain of the reset transistor is connected to the photogate control bus. The invention further employs a first predetermined signal combination to the photogate control bus and the reset control bus that connects the amplifier to the output signal column bus, and a predetermined second signal combination on the photogate control bus and reset control bus that enables setting the charge to voltage conversion node to a second predetermined potential that disconnects the amplifier from the output signal column bus.

19 Claims, 4 Drawing Sheets

OTHER PUBLICATIONS

"A ¼ Inch 330k Square Pixel Progressive Scan CMOS Active Pixel Image Sensor" by Eiji Oba et al. 1997 IEEE International Solid–State Circuits Conference. Session 11, Paper FA 11.1.

"Technology and Device Scaling Considerations for CMOS Imagers" by Hon–Sum Wong. IEEE Transactions on Electron Devices, vol. 43, No. 12, Dec. 1996.

"128×128 CMOS Photodiode–Type Active Pixel Sensor with On–Chip Timing, Control and Signal Chain Electronics" by R.H. Nixon et al. Center for Space Microelectronic Technology, Jet Propulsion Laboratory—California Institute of Technology. Proceedings of the SPIE vol. 2415, Charge–Coupled Devices and Solid–State Optical Sensors V, paper 34 (1995).

"A Small Pixel CMD Image Sensor" by Masanori Ogata et al. IEEE Transactions on Electron Devices, vol. 38, No. 5, May 1991.

"A 250,000–Pixel Image Sensor with FET Amplification at EAch Pixel for High–Speed Television Cameras" by Fumihiko Andoh et al. 1990 IEEE International Solid–State Circuits Conference.

"An 800K–Pixel Color CMOS Sensor for Consumer Still Cameras" by J.E.D. Hurwitz et al. VLSI Vision Ltd.

* cited by examiner

PHOTOGATE ACTIVE PIXEL SENSOR WITH HIGH FILL FACTOR AND CORRELATED DOUBLE SAMPLING

FIELD OF THE INVENTION

This invention relates to the field of solid state photosensors and imagers referred to as Active Pixel Sensors (APS) that have active circuit elements associated with each pixel, and more specifically to Solid State Imagers that employ correlated double sampling (CDS).

BACKGROUND OF THE INVENTION

APS are solid state imagers wherein each pixel contains the typical solid state pixel elements including a photosensing means, reset means, a charge to voltage conversion means, and additionally all or part of an amplifier. The photocharge collected within the pixel is converted to a corresponding voltage or current within the pixel as discussed in prior art documents such as "Active Pixel Sensors: Are CCD's Dinosaurs?", SPIE Vol. 1900-08-8194-1133 July 1993, by Eric Fossum. APS devices have been operated in a manner where each line or row of the imager is selected and then read out using a column select signal as discussed by E. Fossum in "Active Pixel Sensors: Are CCD's Dinosaurs?", SPIE Vol. 1900-08-8194-1133 July 1993 and by R. H. Nixon, S. E. Kemeny, C. O. Staller, and E. R. Fossum, in "128×128 CMOS Photodiode-type Active Pixel Sensor with On-chip Timing, Control and Signal Chain Electronics". Proceedings of the SPIE vol. 2415, Charge-Coupled Devices and Solid-State Optical Sensors V, paper 34 (1995). The selection of rows and columns within an Active Pixel Sensor is analogous to the selection of words and bits in memory devices. Here, the selection of an entire row would be analogous to selecting a word and the reading out of one of the columns of the Active Pixel Sensor would be analogous to selecting or enabling a single bit line within that word. Conventional prior art photogate devices teach architectures employing 4 transistor (4T) designs, where the 4 transistors are typically the Photogate, Row Select, Reset, and Source Follower Amplifier transistors. While this architecture provides the advantages of yielding APS devices having the capability to easily perform CDS an provide low readout noise, these 4T pixels suffer from low fill factor. Fill factor is the percentage of pixel area that is devoted to the photosensor. Each has associated contact regions and signal buses. Since these contact regions are placed in each pixel, and contact regions typically consume a large amount of pixel area due to the overlap of metal layers required, inclusion of theses contact regions in each pixel reduces the fill factor for the pixel because it takes up area that could otherwise be used for the photodetector. Connection to each of these components to the appropriate timing signal is done by metal buses that traverse the entire row of pixels. These metal buses are optically opaque and can occlude regions of the photodetector in order to fit them into the pixel pitch. This also reduces the fill factor of the pixel. Decreasing the fill factor reduces the sensitivity and saturation signal of the sensor. This adversely affects the photographic speed and dynamic range of the sensor, performance measures that are critical to obtaining good image quality.

Prior art devices employing three transistor (3T) based pixels have a higher fill factor than 4T pixels, but these 3T pixels cannot easily perform CDS. Sensors that perform CDS employing 3 transistor based pixels typically first read out and store an image frame comprising a reset level for each pixel on the sensor. Next the signal frame is captured and read out. The reset level frame stored in memory must then be subtracted from the signal frame at each pixel to provide a pixel signal level that is referenced to the pixel reset level prior to integration. This requires an extra frame of memory in the imaging system and an extra step in the digital signal processing chain, thus adversely affect the speed, size and cost of the system.

Typical prior art Photogate APS pixels are shown in FIGS. 1a and 1b. The pixel in FIG. 1a is a prior art 4 transistor pixel that comprises: a photogate photodetector (PG) and transfer transistor (TG); floating diffusion (FD); reset transistor with a reset gate (RG); row select transistor with a row select gate, (RSG); and a source follower input signal transistor (SIG). The pixel in FIG. 1b is also a prior art 4 transistor pixel and where the TG is replaced by a virtual TG where a separate polysilicon gate and associated contact and signal bus is not required. As stated above these 4 transistor pixels provide low readout noise with CDS by inclusion of an extra transistor per pixel. However the area required to implement the $4^{th}$ transistor reduces the fill factor of the pixel compared to the 3 transistor pixel.

It should be readily apparent that there remains a need within the art to provide an alternate pixel architecture that has higher fill factor, and the capability to perform CDS without the need to capture and store entire frames of image data.

SUMMARY OF THE INVENTION

The present invention provides a high fill factor Photogate Active Pixel Architecture with the capability to perform Correlated Double Sampling, (CDS). The functionality of a 4 transistor pixel is maintained while eliminating the separate row select transistor. This is done by using the PG control signal as the Row Select signal for the same row. The preferred embodiment of the invention employs a floating diffusion as the charge to voltage conversion node and specifically envisions embodiments wherein the source of the reset transistor is a floating diffusion. The invention further employs a first predetermined signal to the photogate control bus and a second predetermined signal connected to the reset gate thus enables resetting of the charge to voltage conversion node to a predetermined first potential that connects the amplifier to the output signal column bus.

The present invention provides these features by providing an Active Pixel Sensor having a plurality of pixels with at least one pixel comprising: a photogate photodetector operatively connected to a charge to voltage conversion node; a reset transistor having a source that is connected to the charge to voltage conversion node; a reset gate on the reset transistor connected to a reset control bus and a drain on the reset transistor connected to the photogate and a photogate control bus; an amplifier operatively connected to the charge to voltage conversion node.

ADVANTAGEOUS EFFECT OF THE INVENTION

The present invention provides a Photogate Active Pixel sensor with true Correlated Double Sampling (CDS) using only three transistors resulting in a higher fill factor. The advantage gained is high fill factor and lower temporal noise. No disadvantages are foreseen.

BRIEF DESCRIPTION OF THE DRAWINGS

FIG. 3b is a timing diagram illustrating the operation of the pixel and readout circuit shown in FIG. 3a.

DETAILED DESCRIPTION

Figure 2A:
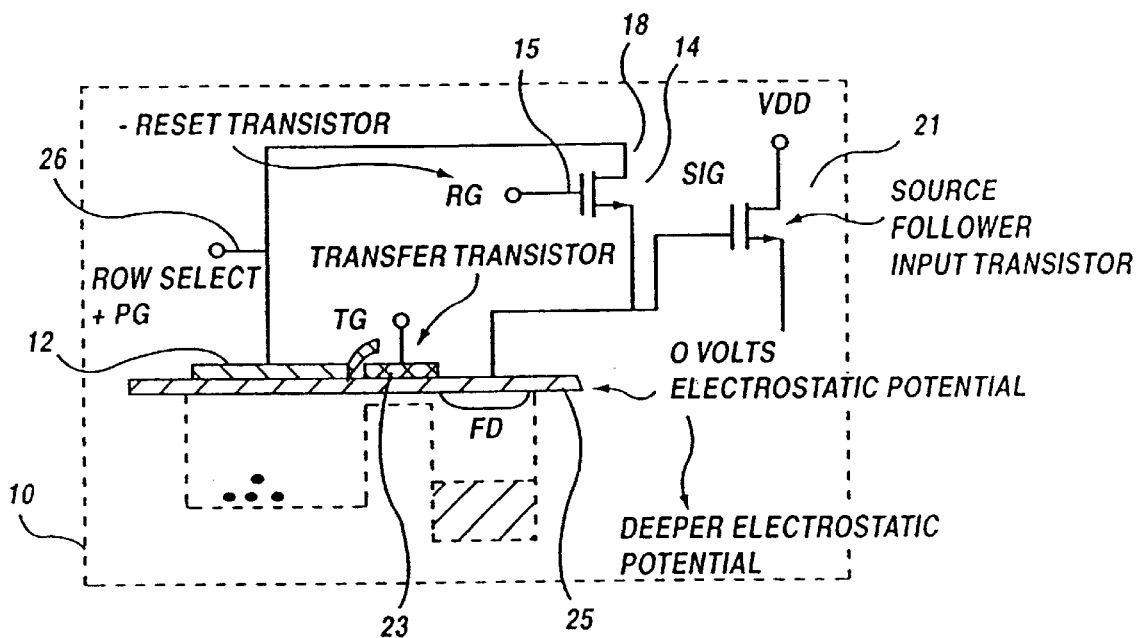
FIG. 2a is a new architecture for a three transistor Photogate Active Pixel Sensor pixel.
Figure 2B:
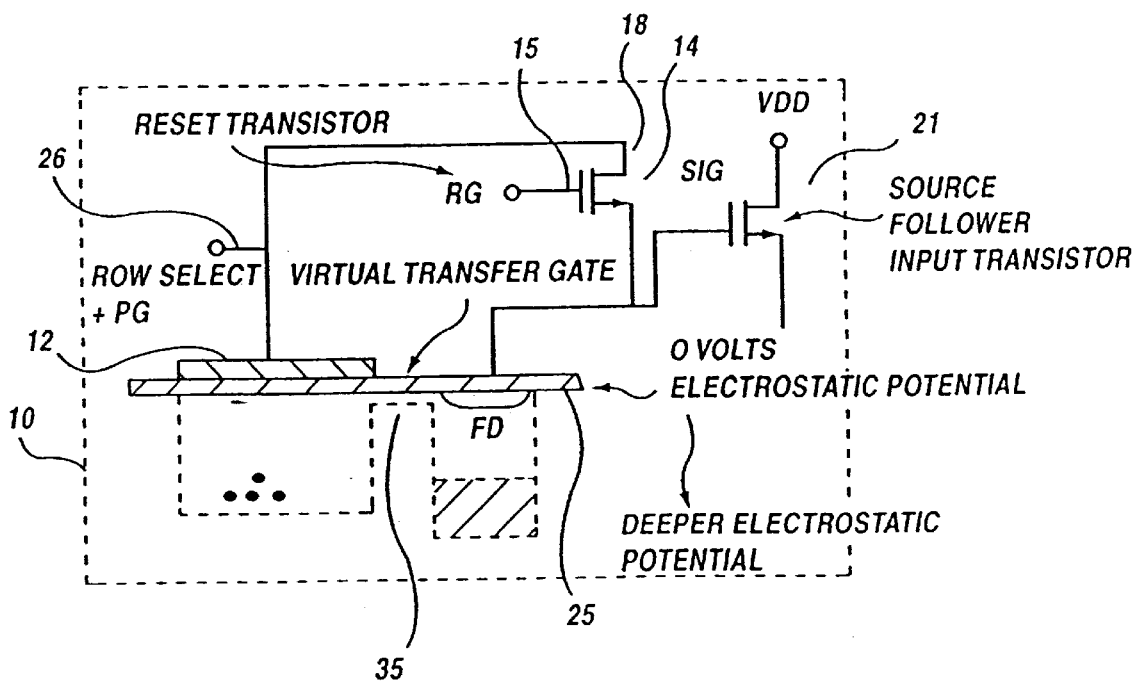
FIG. 2b is a new architecture for a three transistor Photogate Active Pixel Sensor pixel.

FIGS. 2a and 2b are schematic illustrations of the photogate pixel architectures for an Active Pixel Sensor (APS) as envisioned by the present invention. The embodiments shown in FIGS. 2a and 2b envision the best modes known to the inventor. Other physical embodiments are realizable that are obvious variations of the embodiment shown in FIGS. 2a and 2b, as will be discussed further below. The pixel 10 shown in FIGS. 2a and 2b is a single pixel within an array of pixels having numerous rows and columns.

As seen in FIG. 2a, the pixel 10 comprises: a photogate photodetector 12 (PG) and transfer gate (TG) 23; floating diffusion (FD) 25 a reset transistor 14 with a reset gate 15 (RG); a reset drain 18 for the reset transistor 14 is connected to PG 12 by a Row Select+PG (RSPG) signal bus 26; and a source follower input signal transistor 21 (SIG). In FIG. 2b. the pixel 10 shown is identical to that of FIG. 2a except the TG 23 is replaced by a virtual transfer gate 35. In both cases the row select transistor of prior art pixels is eliminated, and the row select process is accomplished in a different manner. In both FIGS. 2a and 2b, the dotted line represents the conduction band minima for that region of the pixel. The PG 12 is shown biased in depletion. It should be noted that the floating diffusion can be functionally replaced by a floating gate or another capacitive element to convert charge to voltage.

Figure 3A:
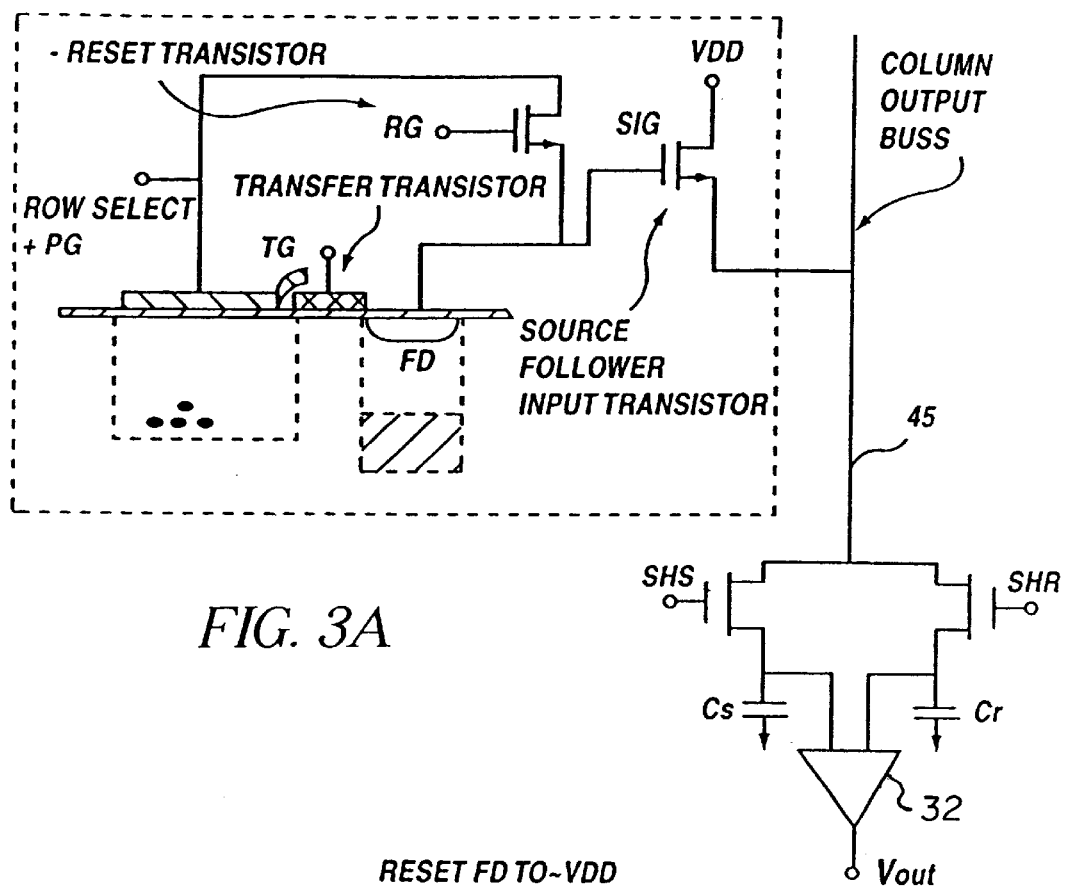
FIG. 3a is a schematic diagram of the pixel in FIG. 2a and the associated pixel readout circuit.
Figure 3B:
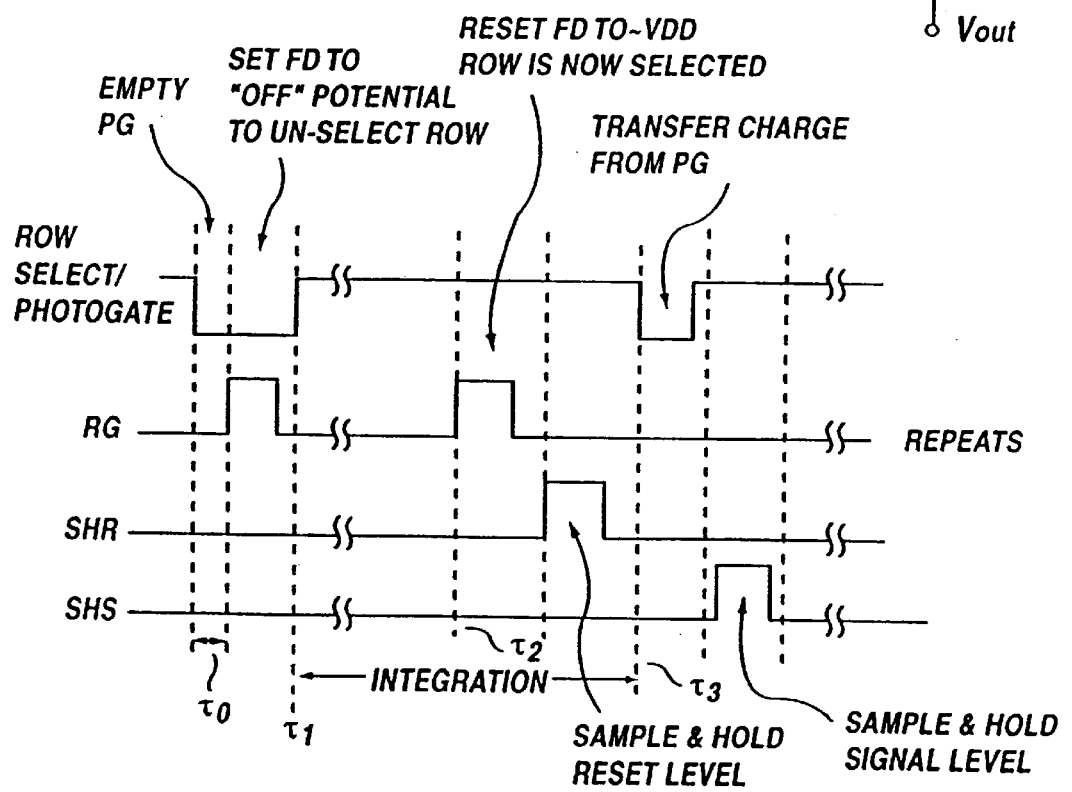

Referring to FIG. 3b, which is a timing diagram used to describe the operation of the pixel shown in FIG. 3a, it should be understood that the pixel operation described takes place for an entire row of pixels 10 in the context of the standard per line rolling shutter operation of CMOS active pixel sensor devices. The TG signal (for transfer gate 23 of FIG. 2a and virtual transfer gate 35 of FIG. 2b) is not included in the timing diagram since this is typically held at a single DC level in the case of FIG. 2a, and there is no TG signal application required for the pixel in FIG. 2b. The electrostatic potential of the TG 23, 35 region is typically deeper than ground potential, but shallower than the depleted photogate 12 potential as indicated by the dotted lines in FIGS. 2a and 2b. Initially, reset gate 15 is at 0 volts and the photogate 12 and the drain 18 of the reset transistor 14 are pulsed to 0 volts, or some other appropriate potential, during the time interval $\tau_0$. Because the drain 18 of reset transistor and the photogate 12 are electrically connected to the same node, a row select function is obtained by application of the photogate signal bus which in the case of the present invention become the Row Select/Photogate signal bus. The combination of signals applied during $\tau_0$ to the RowSelect/Photogate signal bus and to the reset gate 15 empties all electrons from the photogate 12.

Next, the reset gate 15 is pulsed on at the end of the time interval $\tau_0$ with the Row Select/Photogate signal applied to the drain 18 of the reset transistor 14 still held low, (RG goes high), and the floating diffusion 24 is set to 0 volts (or other appropriate potential determined by the level applied to reset drain 18) to shut off signal transistor (SIG) 21, thus "unselecting" that row. At time period $\tau_1$ Row Select/Photogate signal is placed at a high potential (typically VDD) and photogate 12 is depleted allowing for the integration of photoelectrons within photogate 12 to occur. At time $\tau_2$, just prior the expiration of the desired integration time, reset gate 15 is pulsed high causing a reset of the floating diffusion 25 to ~VDD. The reset of floating diffusion 25 causes signal transistor (SIG) 21 to turn on, effectively selecting that pixel (actually all the pixels in that row) for readout. At this time all other rows in the sensor have their floating diffusions set to ~0 volts resulting in their SIG transistors being turned off and, accordingly, resulting in those pixels being disconnected from the column output signal bus 45. The reset level of the floating diffusion 25 is then sampled and held on capacitor Cr by pulsing the sample and hold reset (SHR) signal on and off. Next, at time $\tau_3$ the signal charge is transferred from the photogate 12 to the floating diffusion 25 by pulsing the Row Select/photogate signal low. This only transfers the signal electrons to the floating diffusion 25 since the reset gate 15 is held at 0 volts. The signal level now stored on the floating diffusion 25 is sampled and held on capacitor Cs by strobing SHS. The Reset Gate 15 to Reset Transistor 14 is then turned while RSPG is at 0 volts to un-select the row and to commence integration for that row for the next frame. The initial signal level stored on Cs is then read differentially through difference amplifier 32 with respect to the clamped level stored on Cr in order to cancel the pixel source follower offset voltage.

From the description of operation provided it is evident that this new three transistor photogate pixel architecture provides true CDS output signal without the need for storing a reset frame.

Figure 4:
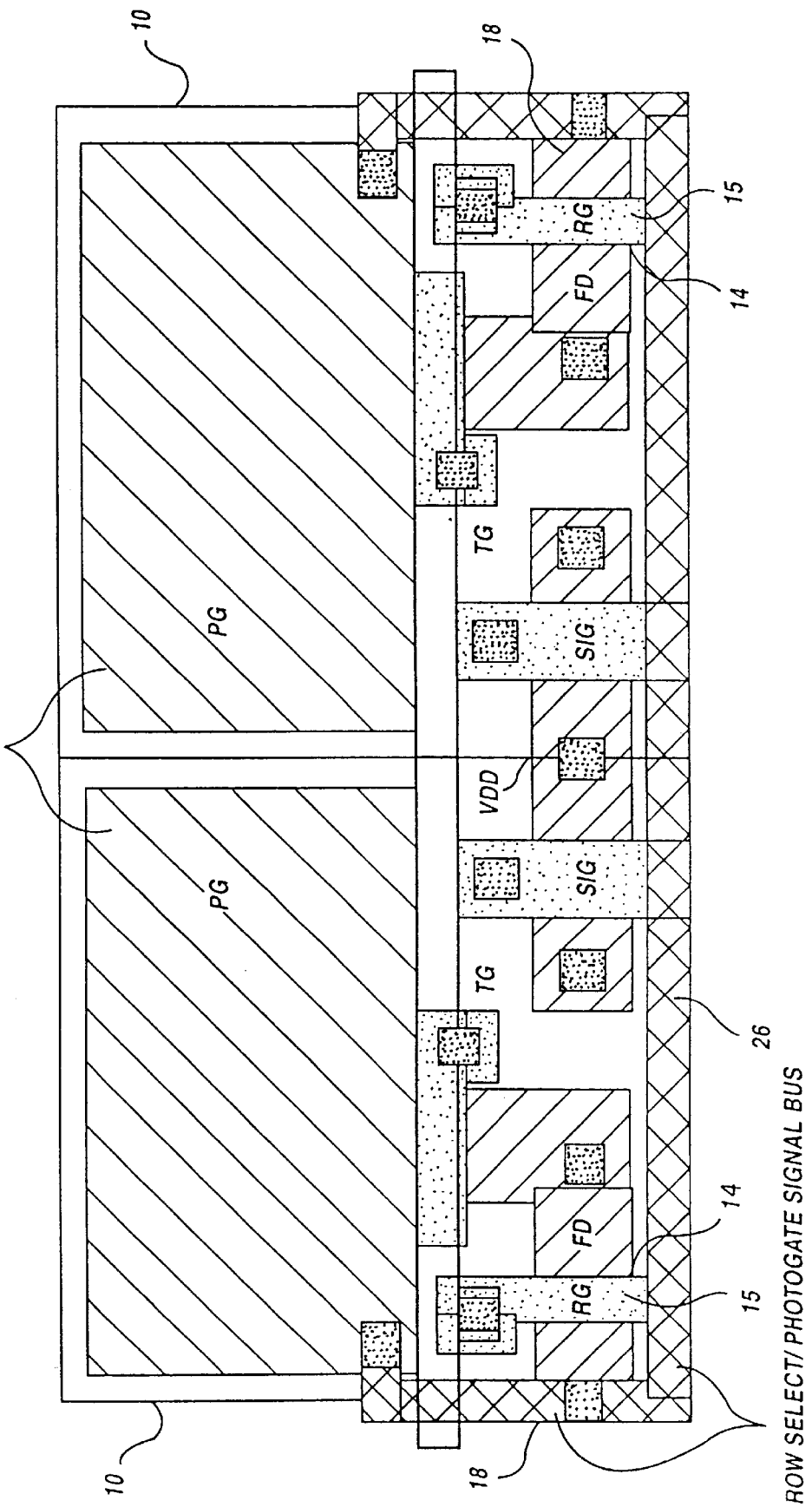
FIG. 4 is a top view of the invention.

FIG. 4 is a top view of the present invention illustrating a pair of pixels 10 within the same row. Both pixels 10 have photogate 12 connected to the Row Select/Photogate signal bus 26 as previously described. Both pixels 10 also have the drain 18 of reset transistor 14 connected to the Row Select/Photogate signal bus 26. Charge is accumulated under the photogates 12 and transferred to the floating diffusions (FD) 25 as previously described. The floating diffusions 25 act as the source to reset transistors 14. Reset gates 15 work in conjunction with the Row Select/Photogate signal bus 26 to control the operation of pixels 10 as previously described by FIGS. 3a and 3b.

Figure 1A:
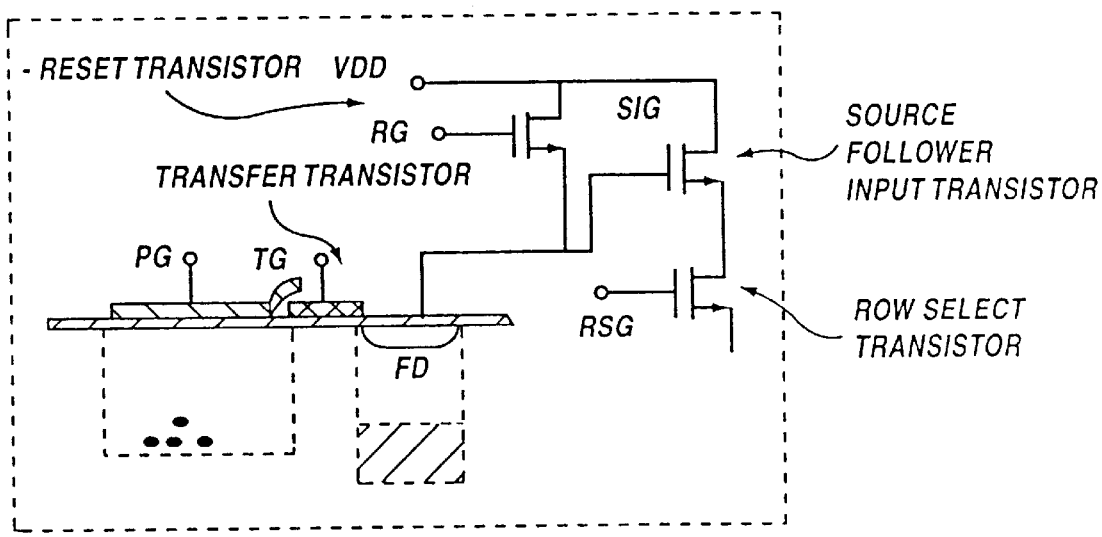
FIG. 1a is a prior art architecture for a four transistor Photogate Active Pixel Sensor pixel.
Figure 1B:
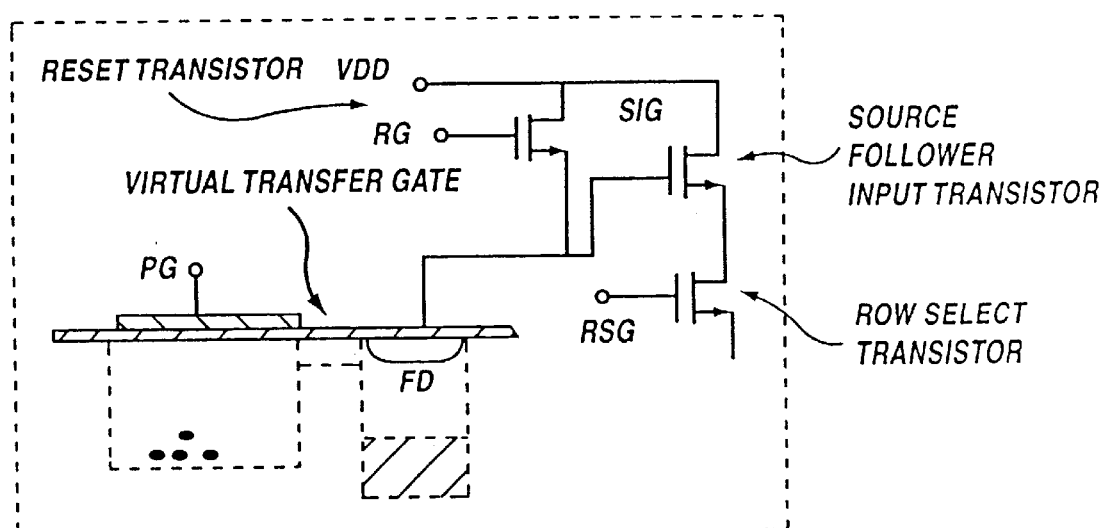
FIG. 1b is a prior art architecture for a four transistor Photogate Active Pixel sensor pixel.

The typical prior art Photogate APS pixel shown in FIG. 1a comprised 4 transistors, and 5 buses. By comparison the new pixel architecture in FIG. 2b comprises only 3 transistors and 4 buses. The elimination of 1 transistor and bus and the associated contact regions provides more pixel area that can be allocated to the photodetector. This provides substantially higher pixel fill factor and consequently higher optical sensitivity.

The foregoing description details the embodiments most preferred by the inventor. Variations of these embodiments will be readily apparent to those skilled in the art. Accordingly, the scope of the invention should be measured by the appended claims.

PARTS LIST 10 pixel
12 photogate
14 reset transistor
15 reset gate
18 reset drain
21 source follower transistor
23 transfer gate
25 floating diffusion
26 row select and photogate signal bus
32 difference amplifier
35 virtual transfer gate
SHS sample hold signal transistor
CS signal storage capacitor
SHR sample hold reset transistor
CR reset storage capacitor

What is claimed is:

1. An active pixel sensor having a plurality of pixels with at least one pixel comprising:

a photogate photodetector operatively connected to a charge to voltage conversion node;

a reset transistor having a source that is connected to the charge to voltage conversion node;

a reset gate on the reset transistor connected to a reset control bus and a drain on the reset transistor connected to the photogate and a photogate control bus;

an amplifier operatively connected to the charge to voltage conversion node.

2. The invention of claim 1 wherein the charge to voltage conversion node is a floating diffusion.

3. The invention of claim 1 wherein the source of the reset transistor is a floating diffusion.

4. The invention of claim 1 wherein the amplifier is a source follower amplifier.

5. The invention of claim 1 wherein a first predetermined signal to the photogate control bus and a second predetermined signal connected to the reset control bus enables transfer of electrons from the photogate to the charge to voltage conversion node and sets the charge to voltage conversion node to a predetermined first potential that turns the amplifier off.

6. The invention of claim 1 wherein a first predetermined signal to the photogate control bus enables transfer of electrons from the photogate to the charge to voltage conversion node.

7. The invention of claim 1 wherein a first predetermined signal to the photogate control bus and a second predetermined signal connected to the reset control bus sets the charge to voltage conversion node to a predetermined first potential that turns the amplifier on.

8. An Active pixel sensor having a plurality of pixels with at least one pixel comprising:

a photogate photodetector operatively connected to a charge to voltage conversion node;

a reset transistor having a source that is connected to the charge to voltage conversion node;

a reset gate on the reset transistor connected to a reset control bus and a drain on the reset transistor connected to the photogate and a photogate control bus;

an amplifier operatively connected to the charge to voltage conversion node and an output signal column bus.

9. The invention of claim 8 wherein a first predetermined signal to the photogate control bus and a second predetermined signal connected to the reset control bus disconnects the amplifier from the output signal column bus.

10. The invention of claim 8 wherein a first predetermined signal to the photogate control bus and a second predetermined signal connected to the reset control bus enables resetting of the charge to voltage conversion node to a predetermined first potential that connects the amplifier to the output signal column bus.

11. An active pixel sensor having a plurality of pixels arranged in rows and columns such that the rows are read out sequentially with at least one pixel comprising:

a photodetector operatively coupled to a charge to voltage conversion means;

a reset device electrically connected to the charge to voltage conversion means;

a first signal bus operatively connected to the photodetector and the reset device, and a second signal bus connected to the reset device;

an amplifier operatively connected to the charge to voltage conversion means; and means for activating the reset device such that the charge to voltage conversion means is sequentially set to a first potential and a second potential;

wherein the means for activating the reset device further comprises a combination of signals on the first and second signal bus that operates to deselect the row associated with the pixel.

12. The active pixel sensor of claim 11 wherein the means for activating the reset device further comprises a combination of signals on the first and second signal bus that operates to reset the charge to voltage conversion means.

13. The active pixel sensor of claim 11 wherein the means for activating the reset device further comprises a combination of signals on the first and second signal bus that operates to select the row associated with the pixel.

14. The active pixel sensor of claim 11 wherein the means for activating the reset device further comprises:

a first combination of signals on the first and second signal bus operates to reset the charge to voltage conversion means and also selects the row associated with the pixel; and a second combination of signals on the first and second signal bus deselects the row associated with the pixel.

15. The active pixel sensor of claim 11 wherein the reset device further comprises:

a reset transistor having a drain connected to the first signal bus and a source connected to the charge to voltage conversion means; and a gate to the reset transistor connected to the second signal bus.

16. The invention of claim 11 wherein the amplifier is a source follower amplifier having a gate coupled to the charge to voltage conversion means.

17. A method of making an active pixel sensor:

providing a pixel having a photodetective element operatively coupled to at least a charge to voltage conversion means;

creating a reset transistor within the pixel having a drain coupled to the photodetector on a first signal bus and a gate to the reset transistor connected to a second signal bus and a source connected to the charge to voltage conversion means; and forming an amplifier that is coupled to both the charge to voltage conversion means and a the reset transistor;

wherein the step of creating further comprises creating means for applying a combination of signals on the first and second signal bus that operates to deselect the row associated with the pixel.

18. The method of claim 17 wherein the step of creating further comprises creating means for applying a combination of signals on the first and second signal bus to reset the charge to voltage conversion means.

19. The method of claim 17 wherein the step of creating further comprises creating means for applying a combination of signals on the first and second signal bus that operate to select the row associated with the pixel.

* * * * *